United States Patent [19]

Deshpande

[11] Patent Number: 5,160,577

[45] Date of Patent: Nov. 3, 1992

[54] METHOD OF FABRICATING AN APERTURE PLATE FOR A ROOF-SHOOTER TYPE PRINTHEAD

[76] Inventor: Narayan V. Deshpande, 101 Highledge Dr., Penfield, N.Y. 14526

[21] Appl. No.: 738,015

[22] Filed: Jul. 30, 1991

[51] Int. Cl.⁵ .................. H01L 21/306; B44C 1/22
[52] U.S. Cl. ......................... 156/644; 156/647; 156/651; 156/657; 156/659.1; 156/662; 346/140 R
[58] Field of Search ............. 156/644, 647, 654, 651, 156/657, 659.1, 661.1, 662, 645; 346/1.1, 76 PH, 140 R

[56] References Cited

U.S. PATENT DOCUMENTS

| | | | |
|---|---|---|---|
| 4,169,008 | 9/1979 | Kurth | 156/600 |
| 4,455,192 | 6/1984 | Tamai | 156/628 |
| 4,789,425 | 12/1988 | Drake et al. | 156/644 |
| 4,791,440 | 12/1988 | Eldridge et al. | 346/140 R |
| 4,914,736 | 4/1990 | Matsuda | 346/140 R |

OTHER PUBLICATIONS

IBM Technical Disclosure Bulletin, vol. 19, No. 6, Nov. 1976, "Nozzle Arrays In Mesa Structures Etched In Single Crystal Silicon".

IBM Technical Disclosure Bulletin, vol. 22, No. 7, Dec. 1979, "Process For Fabricating Ink Jet Nozzles".

Primary Examiner—William A. Powell

[57] ABSTRACT

A method of fabricating an aperture plate for a roof-shooter thermal ink jet printhead wherein a two step orientation dependent etch is conducted on a silicon wafer. The two step etch forms a trough in one face of the silicon wafer and a plurality of apertures in either the same or opposite face as the trough.

9 Claims, 2 Drawing Sheets

METHOD OF FABRICATING AN APERTURE PLATE FOR A ROOF-SHOOTER TYPE PRINTHEAD

BACKGROUND

1. Field of the Invention

The present invention relates generally to a method of fabricating an aperture plate for a roofshooter type printhead and in particular to a method of forming an aperture plate for a printhead, such as a thermal ink jet (TIJ) printhead, by orientation dependent etching.

2. Description of the Related Art

There are two general configurations for thermal drop-on-demand inkjet printheads. In one configuration, droplets are propelled from nozzles in a direction parallel to the flow of ink in ink channels and parallel to the surface of the bubble generating heating elements of the printhead, such as, for example, the printhead configuration disclosed in U.S. Pat. No. 4,601,777 to Hawkins et al. This configuration is sometimes referred to as "edge or side shooters". The other thermal ink jet configuration propels droplets from nozzles in a direction normal to the surface of the bubble generating heating elements, such as, for example, the printhead disclosed in U.S. Pat. No. 4,568,953 to Aoki et al. and U.S. Pat. No. 4,789,425 to Drake et al. This latter configuration is sometimes referred to as a "roofshooter".

In the "roofshooter" printhead disclosed in U.S. Pat. No. 4,789,425, the disclosure of which is herein incorporated by reference, the printhead comprises a silicon heater plate and a fluid directing structural member. The heater plate has a linear array of heating elements, associated addressing electrodes, and an elongated ink feed slot parallel with the heating element array. The structural member contains at least one recess cavity, a plurality of nozzles, and a plurality of parallel walls within the recess cavity which define individual ink channels for directing ink to the nozzles. The recess cavity and feed slot are in communication with each other and form the ink reservoir within the printhead. The ink the recess cavity. The feed slot is precisely formed and positioned within the heater plate by anisotropic etching. The structural member may be fabricated either from two layers of photoresist, a two stage flat nickel electroform, or a single photoresist layer and a single stage flat nickel electroform.

The roofshooter type of printhead has a number of advantages over the side-shooter geometry. First, the roofshooter type does not have any problem with refill, i.e., it can operate at much higher print rates than a sideshooter geometry printhead. In addition, roofshooters do not suffer from air ingestion problems. A sideshooter geometry printhead can ingest air through the nozzles into the ink channels which can cause printing errors. The roofshooter, on the other hand, can not ingest air through the nozzles into the ink channels due to the geometry of the printhead.

Another basic roofshooter type thermal ink jet printhead is disclosed in U.S. Pat. No. 4,791,440 to Eldridge et al. Eldridge shows a printhead wherein a heater array is located on a substrate. A nozzle plate with apertures is bonded on top of the substrate to form a printhead.

There are many methods and processes for fabricating a thermal ink jet printhead. In particular, there are a number of methods for fabricating a aperture plate for a roofshooter type printhead. For example:

U.S. Pat. No. 4,961,821 to Drake et al., the disclosure of which is incorporated herein by reference and assigned to the same assignee as the present application, i.e., Xerox Corporation, discloses a method of orientation dependent etching (ODE) for forming semiconductor wafers which are used for an aperture plate of a thermal ink jet printer.

U.S. Pat. No. 4,455,192 to Tamai discloses a method for the formation of a multi-nozzle ink jet printhead wherein areas on a single crystal silicon plate are doped with impurities to make those areas more etch resistant than a remainder of the plate. Then, a second silicon plate is grown on top of the first. Both plates are then etched at once by anisotropic etching to form an array of nozzles within the first plate and a trough within the second plate.

The Bassous article from the *IBM Technical Disclosure Bulletin*, Vol. 19, No. 6, November 1976, pp. 2249-2250, discloses a nozzle array in a mesa structure etched in single crystal silicon wherein the nozzle array is used for an ink jet printhead. A method of fabricating an array of nozzles comprises: 1) defining a pattern on the front side of the wafer and etching mesas in an anisotropic etching solution; 2) defining a nozzle array pattern; 3) performing a p+ diffusion to a required depth; 4) defining a pattern of windows on the back side of the wafer and anisotropically etching the wafer through to the p+ silicon; and 5) stripping the wafer. FIG. 1D shows an anisotropically etched wafer which has troughs on one side of the wafer and a number of apertures formed within the troughs.

The Galicki et al. article from the *IBM Technical Disclosure Bulletin*, Vol. 22, No. 7, December 1979, pp. 2860-2861, discloses a process for fabricating ink jet nozzles wherein a single crystal silicon substrate is anisotropically etched on one side to form a single opening. The other side of the substrate is then plasma etched to form an aperture as shown in STEP E.

U.S Pat. No. 4,169,008 to Kurth discloses a process for producing uniform nozzle orifices in silicon wafers wherein an aperture plate is formed by a two-stage anisotropic etching process comprising the steps of: 1) etching a front face of a silicon wafer anisotropically to form a pyramidal nozzle; and 2) etching the back face of the silicon wafer anisotropically to form an aperture which is aligned with the nozzle and forms a hole entirely through the wafer.

U.S Pat. No. 4,914,736 to Matsuda discloses a liquid jet recording head having multiple liquid chambers on a single substrate wherein an aperture plate, which may be fabricated from silicon, includes a trough. The trough has a plurality of apertures located within the trough. The trough is placed over the actuating circuitry.

A number of these methods use orientation dependent etching to produce an aperture plate for a thermal ink jet printhead, but these methods do not use a two stage orientation dependent etch.

Orientation dependent etching (ODE) is disclosed in U.S. Pat. No. 4,169,008 to Kurth, the disclosure of which is incorporated herein by reference. First, a silicon wafer is produced which has a major surface lying substantially in the "100" plane. Then, a suitable anisotropic etchant is used to etch a pattern in the silicon wafer. The anisotropic etchant works well normal to the "100" plane as opposed to lateral or parallel to the "100" plane. To control the etch, an etchant masking material is placed on both sides of the silicon wafer.

Holes are then made in the masking material in a certain pattern and etching can commence. Thus, any pattern can be made in the masking material and the etched using ODE. The depth that the etchant goes through the silicon wafer depends on the amount of time the etchant continues. Also, the shape that the etchant etches out has a generally inward sloping shape which is caused by the orientation of the silicon in the wafer.

SUMMARY OF THE INVENTION

It is therefore an object of the present invention to provide a method of fabricating aperture plates for a roofshooter type TIJ printhead wherein a two-step etch process is used.

It is another object of the present invention to provide method of fabricating a nozzle plate for a TIJ printhead wherein a trough and apertures are etched by orientation dependent etching (ODE).

The present invention uses a two step orientation dependent etching to form an aperture plate for a roofshooter type thermal ink jet printhead. The aperture plate has a trough formed by a first etch step and a plurality of nozzles formed within the trough during the second etch step.

BRIEF DESCRIPTION OF THE DRAWINGS

The invention will be described with reference to the following drawings in which like reference numerals denote like elements and wherein.

DETAILED DESCRIPTION OF THE PREFERRED EMBODIMENT

Figure 1:
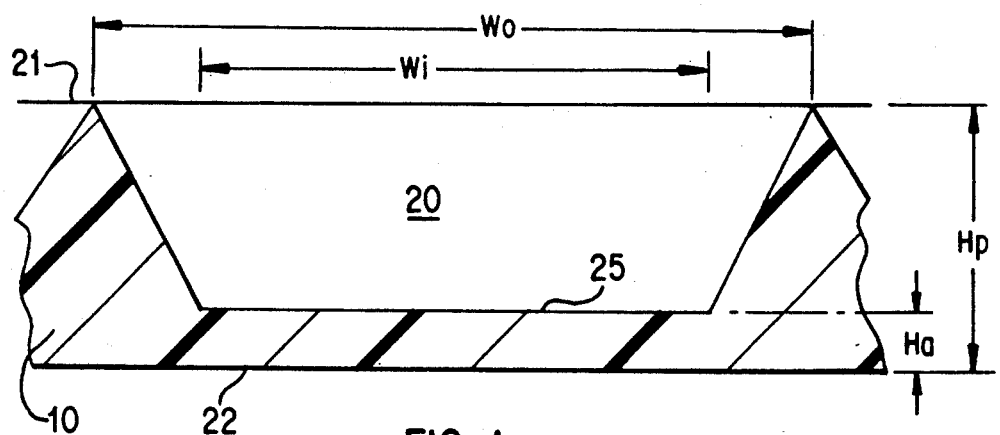
FIG. 1 is a diagram which shows the first stage of the preferred etch process wherein a silicon wafer is orientation dependent etched to form a trough in the wafer.

Now, with reference to FIGS. 1-2, a preferred embodiment of the present invention will be described. A silicon wafer is prepared which has a major surface lying substantially in the "100" plane. The wafer 10 preferably has a height, $H_p$, of 20 mils (500 $\mu$m). This wafer 10 is then masked on a top side 21 with a masking material and anisotropically etched to form a trough 20 within the wafer 10. The trough 20 has an outer width, $W_o$ and an inner width, $W_i$. The trough's sloped ends are formed because ODE etches the wafer 10 according to the orientation of the silicon atoms in the wafer 10. The outer width $W_o$ of the trough is preferably 75.5 mils ($1.8875 \times 10^3$ $\mu$m). The inner width $W_i$ of the trough is preferably 50 mils ($1.25 \times 10^3$ $\mu$m). The trough 20 is etched down, but not completely through the wafer. A remaining bottom wall of the wafer 25 has a thickness equal to the desired thickness of a roofshooter TIJ printhead aperture plate. This distance, known as $H_a$, is preferably equal to 2 mils (50 $\mu$m) for a roofshooter aperture plate.

Figure 3:
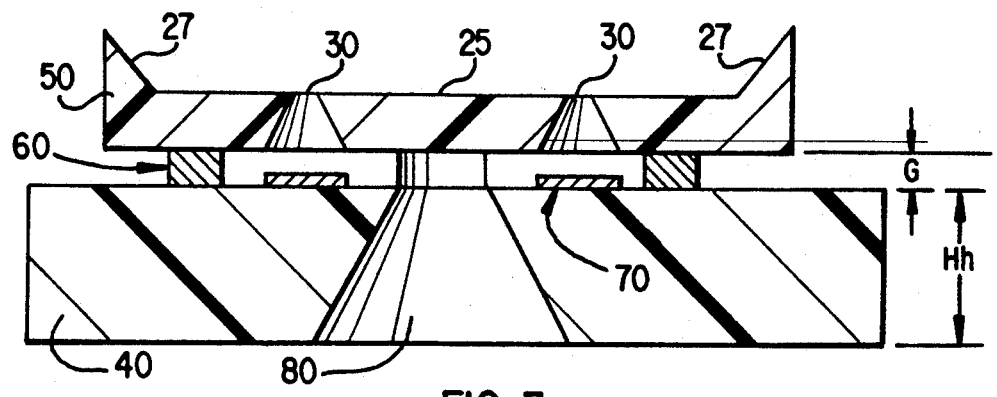
FIG. 3 is a diagram of a roofshooter type thermal ink jet printhead which uses the silicon wafer of FIG. 2 as an aperture plate.

Now, the wafer 10 is masked on an opposite side 22 of the wafer from the trough 20 with a pattern of apertures 30. These apertures 30 will serve as nozzles for the TIJ printhead when the wafer 10 is bonded to a heater plate as shown in FIG. 3. The masked wafer is then anisotropically etched to form the plurality of apertures 30 with sloped edges due to the ODE. For a thermal ink jet printhead, these apertures preferably have an inner and outer width, $N_i$ and $N_o$ respectively, of 50 $\mu$m and 120 $\mu$m. The apertures 30 are etched completely through the bottom wall 25 of the trough 20. The apertures 30 are tapered in such a way, that when a thermal ink jet printhead is fabricated using the aperture plate produced from the silicon wafer 10, the narrower cross-section of the apertures 30 is pointed away from a heater plate 40. This provides the ink which is being ejected from the apertures 30 by the resistors 70 on the heater plate 40 a smooth, high velocity flow. This smooth, high velocity flow permits the thermal ink jet printhead's placement of ink on a piece of paper to be more accurate.

FIG. 3 shows a roofshooter type thermal ink jet printhead which uses an aperture plate 50 which was fabricated by the preferred method of the present invention. The aperture plate 50 includes at least a portion of wafer 10 having the trough 20 and the apertures 30 which were formed by ODE. This aperture plate 50 is bonded to a heater plate 40 which holds the heating elements, associated electronics and appropriate channel geometry formed through polymide processing. Polymide channel walls 60 space the aperature plate 50 from the heater plate 40, thus completing the enclosed channel geometry. The height, G, of the polymide walls 60 is preferably 25 $\mu$m. The size of the heater plate 40, $H_h$, is preferably 20 mils (500 $\mu$m) which is the same thickness as the silicon wafer 10 used to make the aperture plate 50 of the preferred embodiment.

The heater plate 40 includes a plurality of resistors 70 and an ink supply channel 80. The resistors 70 generate heat which causes ink from the ink supply channel 80 to be ejected through the apertures 30. The layout shown, will allow a resolution of 300 spi (spots per inch) to be achieved. A resolution of 600 spi is also possible using a different layout with smaller dimensions. The aperture plate 50 and heater plate 40 are bonded together and then diced into individual dies.

Walls 27 of the trough 10 on the aperture plate 50 may be retained to provide walls which provide a suitable front face seal for the TIJ printhead when it is not in use. Pieces 29 of the walls 27 can also be diced away to leave a flat aperture plate 50 which makes it compatible with other roofshooter type TIJ printhead aperture plates.

Figure 4:
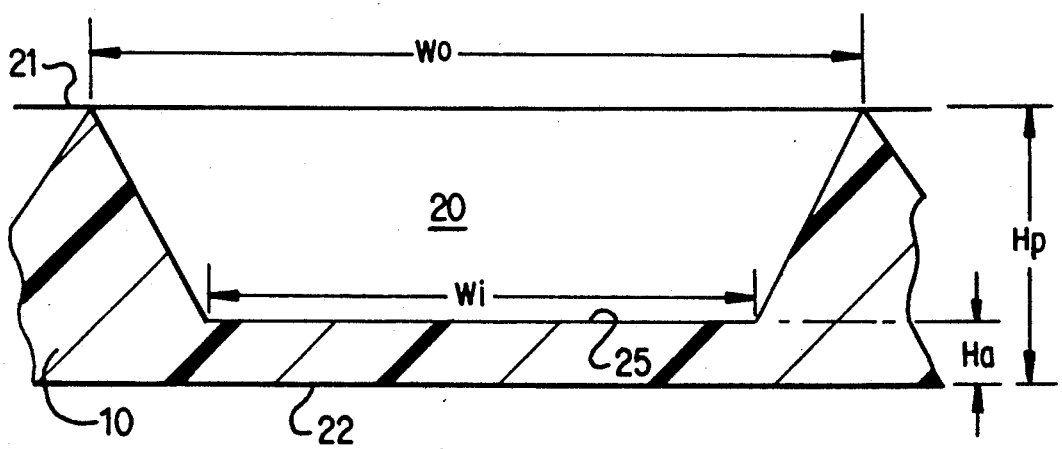
FIG. 4 is a diagram of the first stage of another etch process wherein a silicon wafer is orientation dependent etched to form a trough in the wafer.

Now, with reference to FIGS. 4 and 5, another embodiment of the present invention will be described. FIG. 4 shows a silicon wafer 10 after it has been orientation dependent etched to form a trough 20 as in FIG. 1. Thus, the method of fabricating the trough 20 will not be described again.

Figure 2:
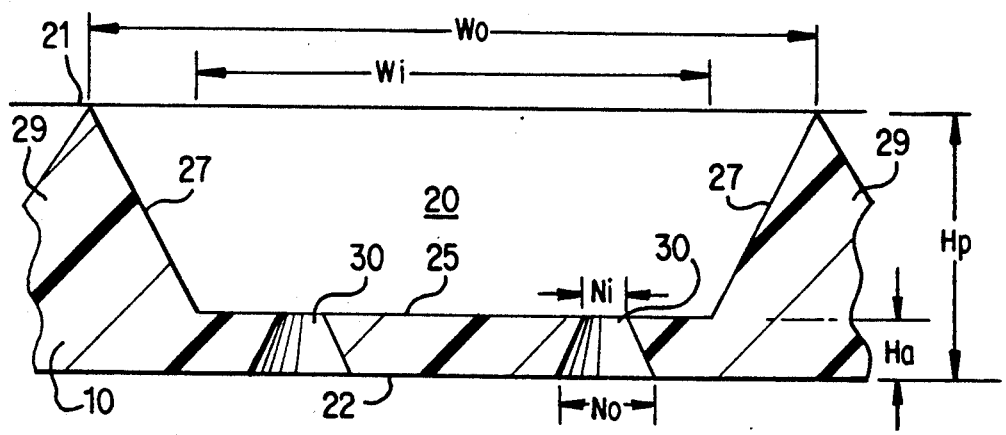
FIG. 2 is a diagram of the second stage of the preferred etch process wherein the silicon wafer of FIG. 1 is orientation dependent etched a second time from the opposite side of the wafer to form a plurality of apertures within the trough.

Once the trough 20 is fabricated with the same dimensions as the trough in FIG. 1, the bottom 25 of the trough is masked to define a plurality of apertures. The wafer is then etched by ODE to form a plurality of apertures 35 which are tapered inwardly towards the bottom side 22 of the wafer 10. These apertures 35 have the same dimensions, namely $N_o=120$ μm and $N_i=50$ μm, as the aperture of the preferred embodiment. The apertures 35 are tapered in such a way, that when a thermal ink jet printhead is fabricated using an aperture plate 100 produced from the silicon wafer 10, the narrower cross-section of the apertures 35 is pointed away from a heater plate 40. This provides the ink which is being ejected from the apertures 35 by the resistors 70 on the heater plate 40 with a smooth, high velocity flow. This smooth, high velocity flow permits the thermal ink jet printhead's placement of ink on a piece of paper to be more accurate. These apertures 35 are in the reverse direction of the apertures 30 of the preferred embodiment. Thus, the way the apertures 35 are formed means that a heater plate 40 would necessarily be located within the trough 20 or on top of the trough to make the apertures 35 have their narrowest cross section away from the heater plate 40.

Figure 5:
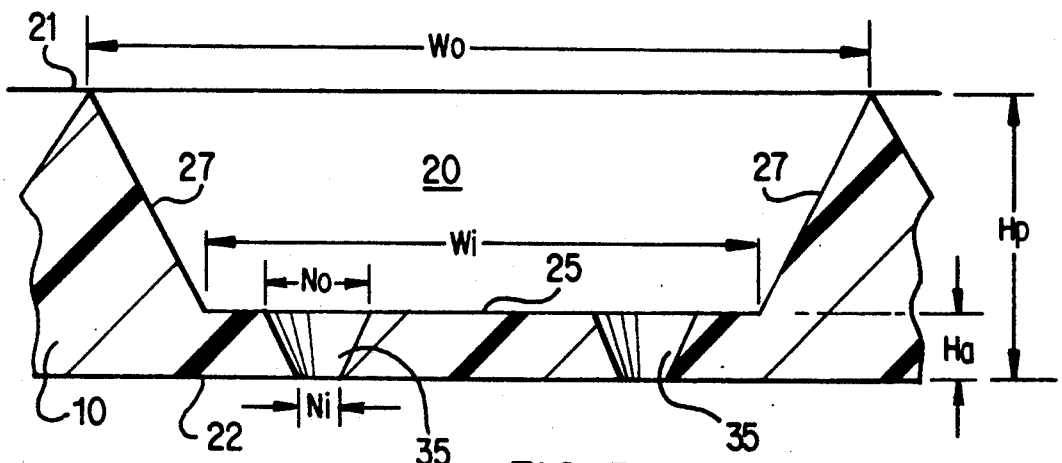
FIG. 5 is a diagram of the second stage of another etch process wherein the silicon wafer of FIG. 4 is orientation dependent etched a second time from the same side as the trough to form a plurality of apertures within the trough.
Figure 6:
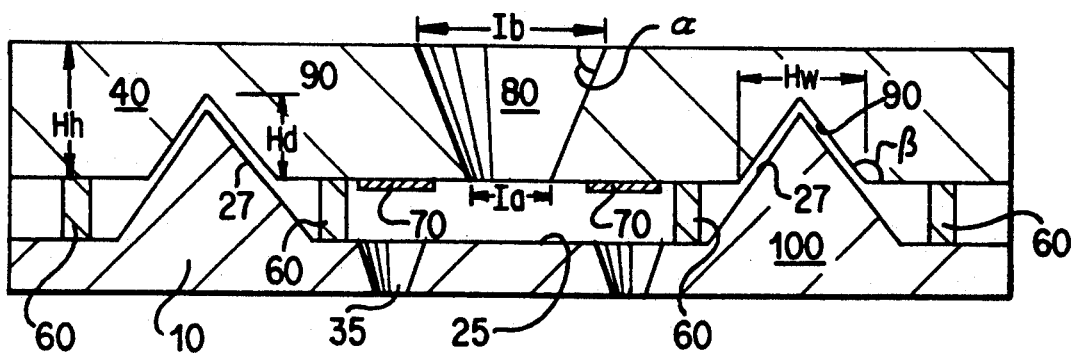
FIG. 6 is a diagram of a roofshooter type thermal ink jet printhead which uses the silicon wafer of FIG. 5 as an aperture plate.

Now, with reference to FIG. 6, a roofshooter TIJ printhead is shown fabricated out of the aperture plate 100 shown in FIG. 5. All of the elements within the heater plate 40 are identical to the previous preferred embodiment. The heater plate 40 will have to be etched from both sides so that the ink feed hole 80 is etched entirely through the heater plate while a pair of side grooves 90 are etched only partially through the heater plate to a depth $H_d$. The width of the grooves 90 is $H_w$. The ink feed hole 80 has an inner width, $I_a$, and an outer width, $I_b$.

The slope angle of the walls of the ink feed hole 80 is α which is preferably equal to 54.7 degrees. The complement slope angle of the groove wall is β, which is preferably equal to 125.3 degrees (i.e., the actual slope of the walls is 54.7 degrees).

The relationships between $H_w$, $H_d$, $I_a$, $I_b$ and $H_h$ are:

$$H_d = \frac{H_w}{2} \tan(54.7°) = \frac{H_w}{2} (1.41) \quad (1)$$

$$H_d = 0.706(H_w)$$

and $$H_h = \frac{I_b - I_a}{2} \times (1.41) \quad (2)$$

These equations allow one of ordinary skill in the art to fabricated a heater plate 40 which would have the correct dimensions necessary to be use with the aperature plate 100.

The invention has been described with reference to a preferred embodiment thereof, which is intended to be illustrated and not limiting. Many modifications and variations are apparent from the foregoing description of the invention and all such modifications and variations are intended to be within the scope of the present invention. Accordingly, variations of the invention may be made without departing from the spirit and scope of the present invention as defined in the following claims.

What is claimed is:

1. A method of fabricating a nozzle plate for a roofshooter type thermal ink jet printhead, comprising the steps of:
    a) etching a trough in a first planar surface of a silicon wafer by orientation dependent etching, said trough extending less than an entire thickness through said silicon wafer to define a bottom wall of predetermined dimensions, a distance between said bottom wall and a second planar surface, opposite from said first planar surface of said silicon wafer, defining a thickness of a nozzle containing portion of said nozzle plate;
    b) placing an etch resistant mask on said second planar surface, said mask comprising a pattern defining a plurality of apertures thereon; and
    c) etching a plurality of nozzle defining apertures from said second planar surface between said bottom wall and said second planar surface of said silicon wafer by orientation dependent etching, said plurality of nozzle defining apertures being defined within the predetermined dimensions of said bottom wall, said etching of said plurality of nozzles being a distinct, separate etching step from the etching which forms said trough.

2. The method of claim 1, wherein said etching of said nozzle defining apertures extends from said second planar surface toward said bottom wall so that exits of said nozzles are located on said bottom wall.

3. The method of claim 1, wherein said trough etching etches said trough to a predetermined depth such that a predetermined thickness $H_a$ exists in said silicon wafer in a direction perpendicular to said second planar surface measured from said second planar surface to said bottom wall.

4. The method of claim 1, further including the step of dicing said wafer perpendicular to said first planar surface substantially adjacent to said trough.

5. A method of fabricating a nozzle plate for a roofshooter type thermal ink jet printhead, comprising the steps of:
    a) etching a trough in a first planar surface of a silicon wafer by orientation dependent etching, said trough extending less than an entire thickness through said silicon wafer to define a bottom wall, a distance between said bottom wall and a second planar surface, opposite from said first planar surface of said silicon wafer, defining a thickness of a nozzle containing portion of said nozzle plate;
    b) placing an etch resistant mask on said bottom wall, said mask comprising a pattern defining a plurality of apertures thereon; and
    c) etching a plurality of nozzle defining apertures from said bottom wall between said bottom wall and said second planar surface of said silicon wafer by orientation dependent etching, said etching of said plurality of nozzles being a distinct, separate etching step from the etching which forms said trough.

6. The method of claim 5, wherein said etching of said nozzle defining apertures extends from said bottom wall toward said second planar surface so that exits of said nozzles are located on said second planar surface.

7. The method of claim 5, wherein said trough etching etches said trough to a predetermined depth such that a predetermined thickness $H_a$ exists in said silicon wafer in a direction perpendicular to said second planar surface measured from said second planar surface to said bottom wall.

8. The method of claim 5, further including the step of dicing said wafer perpendicular to said first planar surface adjacent to said trough.

9. A method of fabricating a roofshooter type thermal ink jet printhead comprising an aperture plate having a plurality of nozzles and a heater plate having a plurality of heating elements on a first planar surface thereof corresponding to the plurality of nozzles, the method comprising the steps of:

a) etching a trough along a longitudinal axis of a first planar surface of a silicon wafer by orientation dependent etching, said trough including angled side walls and extending less than an entire thickness through said silicon wafer to define a bottom wall, a distance between said bottom wall and a second planar surface, opposite from said first planar surface of said silicon wafer defining a thickness of a nozzle containing portion of said aperture plate;

b) placing an etch resistant mask on said bottom wall, said mask comprising a pattern defining a plurality of apertures thereon;

c) etching a plurality of nozzle defining apertures in said bottom wall through said etch resistant mask, by orientation dependent etching, said apertures extending between said bottom wall and said second planar surface of said silicon wafer said etching of said plurality of nozzles being a distinct, separate etching step from the etching which forms said trough;

d) etching said heater plate to provide an ink feed hole; and e) etching two grooves of a predetermined depth on said first planar surface of said heater plate, one groove being on each side of said heater elements along a longitudinal axis of said first planar surface, by orientation dependent etching, for mating with said side walls of said trough.

* * * * *

UNITED STATES PATENT AND TRADEMARK OFFICE
CERTIFICATE OF CORRECTION

PATENT NO. : 5,160,577
DATED : November 3, 1992
INVENTOR(S) : Narayan V. DESHPANDE It is certified that error appears in the above-identified patent and that said Letters Patent is hereby corrected as shown below:

On the title page, under "Inventor" insert --[73] Assignee: Xerox Corporation, Stamford, Conn.--.

Signed and Sealed this

Twenty-sixth Day of October, 1993

Attest:

BRUCE LEHMAN

Attesting Officer    Commissioner of Patents and Trademarks